United States Patent [19]
Kim

[11] Patent Number: 5,881,015
[45] Date of Patent: Mar. 9, 1999

[54] INTERNAL CONSTANT VOLTAGE CONTROL CIRCUIT FOR MEMORY DEVICE

[75] Inventor: Ju Han Kim, Suwon, Rep. of Korea

[73] Assignee: LG Semicon Co., Ltd., Choongcheongbuk-Do, Rep. of Korea

[21] Appl. No.: 915,599

[22] Filed: Aug. 21, 1997

[30] Foreign Application Priority Data

Mar. 22, 1997 [KR] Rep. of Korea ............... 9914/1997

[51] Int. Cl.$^6$ ............................................. G11C 7/00
[52] U.S. Cl. ................................... 365/229; 365/226
[58] Field of Search ........................ 365/185.18, 185.33, 365/185.21, 185.23, 226, 229, 27

[56] References Cited

U.S. PATENT DOCUMENTS 4,903,237  2/1990  Rao ................................. 365/185.21
5,740,109  4/1998  Morton et al. ..................... 365/185.33

Primary Examiner—David Nelms
Assistant Examiner—Thong Q. Le

[57] ABSTRACT

An internal constant voltage control circuit for a semiconductor memory device includes a current source for generating voltage in accordance with current when power is turned on, a bias circuit for outputting a first bias voltage when power is turned on, a first level shifter for receiving the output voltage of the current source and outputting a first voltage, a second level shifter for receiving the output voltage of the bias circuit and outputting a second voltage, and a buffer for differentially amplifying the output voltage of the first level shifter and the output voltage of the second level shifter, and generating an internal voltage. The circuit decreases operation current by reducing an internal voltage during a low temperature operation and securing a timing margin between signals, thereby stabilizing a low temperature operation.

17 Claims, 2 Drawing Sheets

INTERNAL CONSTANT VOLTAGE CONTROL CIRCUIT FOR MEMORY DEVICE

BACKGROUND OF THE INVENTION

1. Field of the Invention

The present invention relates to a semiconductor memory device, and more particularly to an internal constant voltage control circuit for a semiconductor memory device capable of being stably operated at a lower temperature.

2. Description of the Prior Art

As shown in FIG. 1, an internal constant voltage control circuit for a semiconductor memory device according to a conventional art includes: a current source 110 for receiving a supply voltage Vcc when switches S1, S2 are turned on and outputting current $I_R$; a voltage output unit 120 for generating voltage $V_{LB}$ in accordance with the output current $I_R$ of the current source 110; a level shifter 130 for determining voltage $V_{LN}$ in accordance with supply voltage Vcc being applied thereto; and a buffer 140 for differentially amplifying the output voltage $V_{LB}$ of the voltage output unit 120 and the output voltage $V_{LN}$ of the level shifter 130 and generating internal voltage $V_L$.

In the current source 110, there is formed a current mirror which includes a PMOS transistor M1 to the source of which is applied supply voltage Vcc, and another PMOS transistor M2 which receives supply voltage Vcc via a variable resistance $R_R$. The gate and drain of the PMOS transistor M1 and the gate of the PMOS transistor M2 are connected in common to a node which is earthed sequentially via an NMOS transistor M3 and the switch S1. The drain of the PMOS transistor M2 is grounded sequentially via the NMOS transistor M4 and the switch S2 and at the same time it is connected to the respective gates of the NMOS transistors M3, M4. The connection node between the gates of the NMOS transistors M3, M4 is applied to the gate of the NMOS transistor M5 of the voltage output unit 120. Here, to the variable terminal of the variable resistance $R_R$ there is applied a supply voltage Vcc.

Also, in the voltage output unit 120, the drain of the NMOS transistor M5 is connected to the variable resistance $R_L$ through which is applied the supply voltage Vcc. The source of the NMOS transistor M5 is connected to ground voltage via a switch S3. The variable terminal of the variable resistance $R_L$ is connected to the level shifter 130 via a switch S4. A connection node between the variable resistance $R_L$ and the NMOS transistor M5 is connected to the level shifter 130 via a switch S5.

In the level shifter 130, a condenser (or capacitor) C1 having applied thereto the supply voltage Vcc and the switch S4 in the voltage output unit 120 are respectively connected to the gate of a PMOS transistor M6 (to the drain of which is applied supply voltage Vcc). The PMOS transistor M6 is connected to ground voltage via diodes M7, M8 wherein the gate and the drain of each of the diodes M7, M8 are connected to each other, so that voltage $V_{LB}$ is outputted from a connection node between the PMOS transistor M6 and the diode M7.

Referring to the buffer 140, the gate and drain of a PMOS transistor M9 applied thereto by supply voltage Vcc and the drain of a PMOS transistor M10 are connected in common to a node which is connected to the drain of an NMOS transistor M11 (to the gate of which is applied the output voltage $V_{LB}$ of the voltage output 120). The drain of the NMOS transistor M11 is connected to the drain of an NMOS transistor M12 (to the gate of which is applied the output voltage $V_{LN}$ of the level shifter 130). The drain of the PMOS transistor M10 is connected to the drain and the gate of the NMOS transistor M13, respectively, so that an internal voltage $V_L$ can be generated from the connection node. The sources of the NMOS transistors M11, M12, M13 are connected to ground voltage via an NMOS transistor M14 (to the gate of which is applied a bias voltage $V_B$). Here, reference numeral C2 denotes a condenser connected between the gate of the NMOS transistor M11 and supply voltage Vcc, and reference numeral C3 denotes a condenser connected between the gate of the NMOS transistor M12 and ground voltage.

The operation of the thusly constituted conventional voltage control circuit for a memory device will now be described.

First, with power turned on, when a control signal Ø1 is turned on, the current $I_R$ flows through the current source 110. The current $I_R$ flows to the PMOS transistor M2 in accordance with the PMOS transistors M1, M2, M3 serving as a current mirror. A gate voltage for the NMOS transistors M3, M4 is determined in accordance with the current $I_R$. At this time, the gate voltage of the NMOS transistor M4 in the current source 110 becomes equivalent to a gate voltage of the NMOS transistor M5 of the voltage output unit 120.

Therefore, in accordance with the gate voltage of the NMOS transistor M6 the current $I_L$ flows through the voltage output unit 120, so that the supply voltage Vcc serves to generate the voltage $V_{LB}$ which is pressure-reduced to a predetermined extent in the variable resistance $R_L$, and the pressure-reduced voltage $V_{LB}$ is also applied to a connection node $N_B$ of the variable terminal of the variable resistance $R_L$.

When a control signal Ø2 is turned on, the switches S4, S5 are turned on to thereby transmit the voltage in the variable terminal of the resistance $R_L$ to the level shifter 130, and in accordance with the resistance $R_L$ the voltage which is pressure-reduced to a predetermined extent is transmitted to the buffer 140.

At this time, the voltage $V_{LN}$ in the level shifter 130 is determined in accordance with the PMOS transistors M6, M7, M8. The gate voltages $V_{GS}$ of the transistors M7, M8 are determined in accordance with a gate voltage $V_{GS6}$ of the PMOS transistor M6, so that because the gate voltage $V_{GS6}$ of the PMOS transistor M6 denotes '$V_{DS6}$', the value of the voltage $V_{LN}$ becomes '$2V_{GS}$'.

The gate voltage $V_{GS6}$ of the PMOS transistor M6 is determined by the current $I_L$ flowing through the variable resistance $R_L$, wherein the current $I_L$ is controlled by the gate voltage of the NMOS transistor M5.

In the buffer 140, when the bias voltage $V_B$ is turned to a high level and the NMOS transistor M14 is turned on, the NMOS transistors M11, M12 respectively serving as a differential amplifier differentially amplifies the output voltage $V_{LB}$ of the voltage output unit 120 and the output voltage $V_{LN}$ if the level shifter 130. In accordance with the obtained difference the current flowing through the PMOS transistor M10 is determined for thereby generating the internal voltage $V_L$.

The level of the internal voltage $V_L$ is rendered to follow the higher level of the input voltages $V_{LN}$, $V_{LB}$.

That is, with power turned on, during a time in which supply voltage Vcc is being turned to '5 V', the output voltage $V_{LN}$ of the level shifter 130 is larger than the output voltage $V_{LB}$ of the voltage output unit 120, thereby starting the operation of the NMOS transistor M12. From a time point in which the supply voltage Vcc is becoming larger than '5 V', the voltage $V_{LB}$ becomes larger than the voltage $V_{LN}$, so that with the NMOS transistor M11 starting its operation, the internal voltage $V_L$ is generated in accordance with a graph as shown in FIG. 2, whereby '3.3 V' of constant voltage is generated around the operative voltage (5 V) with regard to the external voltage Vcc.

According to the above-described operation, the internal voltage $V_L$ is generated in accordance with the current $I_R$ which is generated by a difference between a high threshold voltage of the PMOS transistor M2 and a standard threshold voltage of the PMOS transistor M1, thereby maintaining a constant voltage irrespective of a temperature variation.

However, the conventional voltage control circuit generates a constant voltage with regard to a temperature variation, whereby a larger current is flowed therethrough during a low temperature operation than during a high temperature operation. Also, the conventional voltage control circuit causes a signal transition time to be faster for thereby decreasing a timing margin, and because a large amount of current being flowed therethrough leads to noise around a power source wire and a signal wire, there may occur an error operation.

That is, as shown in FIG. 2, when around supply voltage Vcc (=5 V) the NMOS transistors M11, M12 are respectively turned on, the current flow becomes increased, whereby the level of the internal voltage $V_L$ is raised to as high as the voltage difference $\Delta V_L$ for thereby resulting in an error operation.

SUMMARY OF THE INVENTION

Accordingly, it is an object of the present invention to provide an internal constant voltage control circuit for a semiconductor memory device capable of decreasing operation current by reducing an internal voltage during a low temperature operation and securing a timing margin between signals, thereby stabilizing a low temperature operation.

To achieve the above-described object, there is provided an internal constant voltage control circuit for a semiconductor memory device which includes a current source for generating voltage in accordance with current when power is turned on, a bias circuit for outputting a first bias voltage when power is turned on, a first level shifter for receiving the output voltage of the current source and outputting a first voltage, a second level shifter for receiving the output voltage of the bias circuit and outputting a second voltage, and a buffer for differentially amplifying the output voltage of the first level shifter and the output voltage of the second level shifter, and generating an internal voltage.

DETAILED DESCRIPTION OF THE INVENTION

Figure 1:
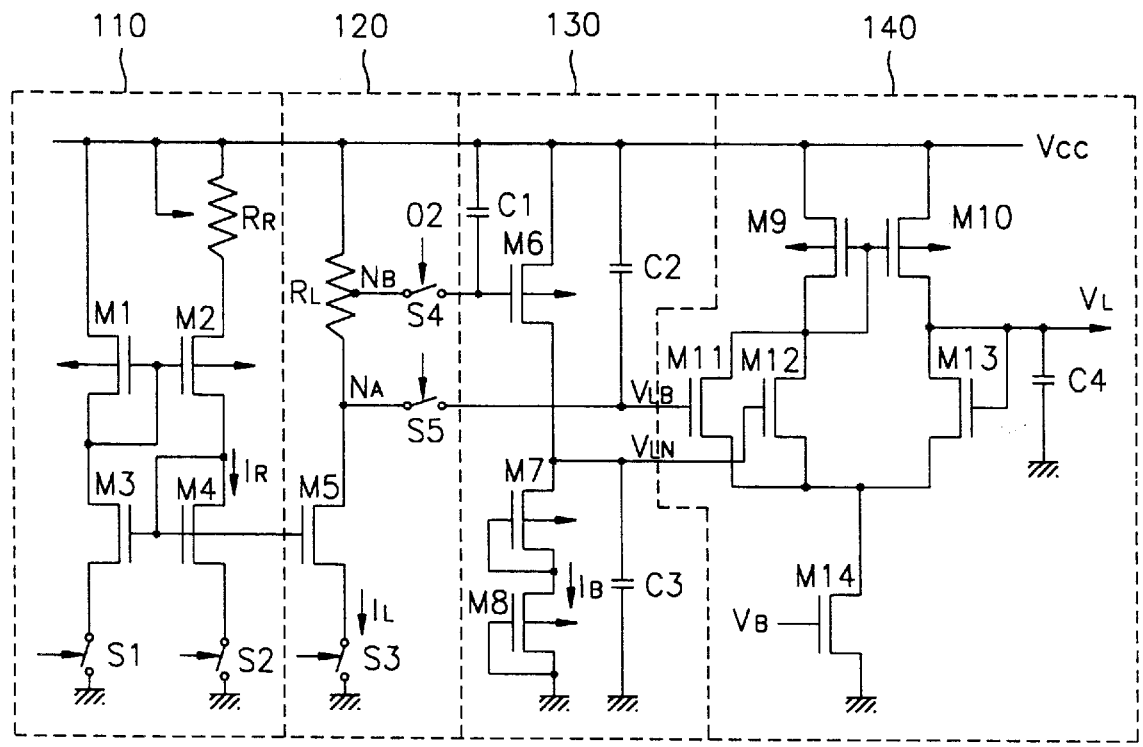
FIG. 1 is a circuit view of a conventional constant voltage control circuit for a semiconductor memory device.
Figure 2:
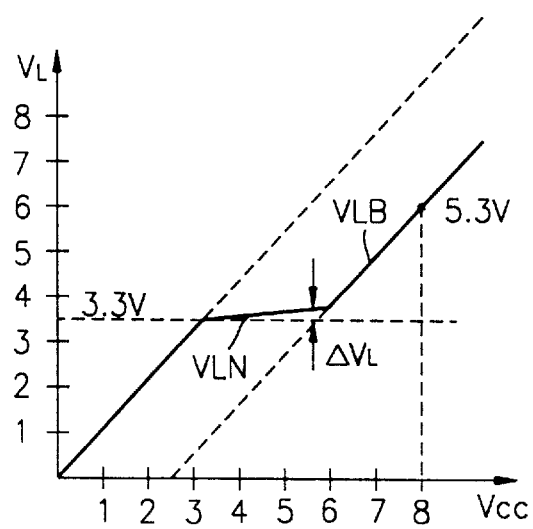
FIG. 2 is a graph illustrating a wave form in accordance with an internal voltage in the circuit of FIG. 1.
Figure 3:
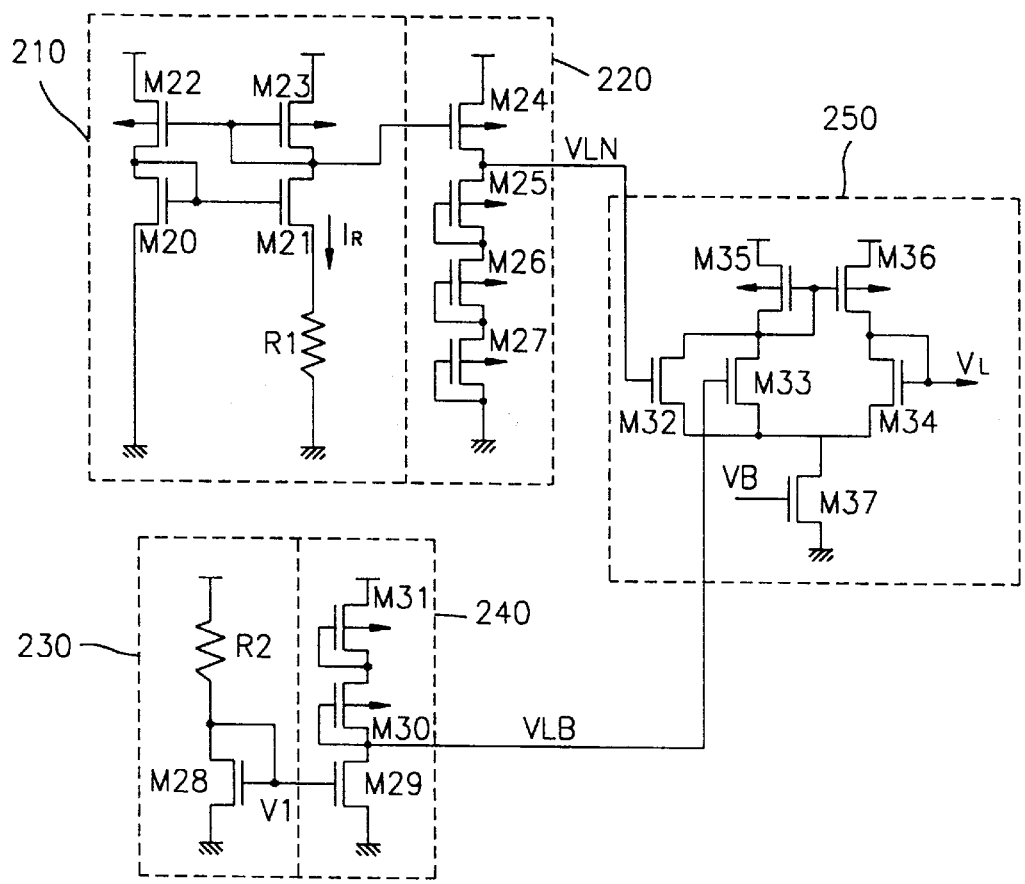
FIG. 3 is a circuit view of an internal constant voltage control circuit for a semiconductor memory device according to a preferred embodiment of the present invention.

As shown in FIG. 3 illustrating an internal constant voltage control circuit for a memory device according to the present invention, the circuit includes: a current source 210 for generating voltage in accordance with the flow of current $I_R$ when power is turned on; a first level shifter 220 for controlling voltage $V_{LN}$ in accordance with the flow of current $I_R$ of the current source 210; a bias circuit 230 for outputting voltage V1 when power is turned on; a second level shifter 240 for receiving the output voltage V1 of the bias circuit 230 and controlling voltage $V_{LB}$; and a buffer 250 for differentially amplifying the output voltage $V_{LB}$ of the first level shifter 220 and the output voltage $V_{LN}$ of the second level shifter 240 and generating internal voltage $V_L$.

In the current source 210, the gate of NMOS transistor M21 (the source of which is connected to ground voltage via resistance R1) is connected to a connection node which is connected in common to the gate and the drain of the NMOS transistor M20 (the source of which is connected to ground voltage). The connection node is connected to the drain of PMOS transistor M22 (the source of which is applied to supply voltage Vcc). The gate of the PMOS transistor M22 is connected in common to a connection node which is in turn connected to the gate and the drain of the PMOS transistor M23 (to the source of which is applied supply voltage Vcc) and the drain of the NMOS transistor M21. The connection node is also connected the first level shifter 220.

The resistance R1 is formed of polysilicon, so that although in accordance with a lowered temperature in the circuit the current flowing through the resistance R1 is lessened, the amount of current variation becomes virtually zero.

Also, in the first level shifter 220, the gate of the PMOS transistor M24 is connected the output terminal of the current source 210 and the source is connected to the supply voltage Vcc. The drain of the PMOS transistor M24 is connected to the source of the PMOS transistor M25. The respective gates and drains of the PMOS transistor M25 as well as the PMOS transistors M26, 27 are connected are connected in a diode configuration. The diodes M25, M26 and M27 are connected to ground voltage, so that voltage $V_{LN}$ can be generated at the connection node between the PMOS transistors M24, M25.

Referring to the bias circuit 230, the drain and the gate of the NMOS transistor M28 (the source of which is connected to ground voltage) are respectively connected to a connection node which is also connected to the resistance R2 connected to supply voltage Vcc. The connection node is connected to the second level shifter 240. Here, the lower a temperature in the circuit, the smaller becomes the value of the resistance R2.

Further, in the second level shifter 240, the PMOS transistors M31, M30 (the respective gates and the drains of which are connected to each other in a diode configuration and the NMOS transistor M29 (the gate of which is connected to an output node of the bias circuit 230) are serially connected between supply voltage Vcc and ground voltage. A connection node between the PMOS transistor M30 and the NMOS transistor M29 is provided to generate voltage $V_{LB}$.

In the buffer 250, the gate and drain of the PMOS transistor M35 (to the source of which is applied supply voltage) and the gate of the PMOS transistor M36 are connected in common to a connection node, which is in turn connected to the drain of the NMOS transistor M33 (to the gate of which is applied the output voltage $V_{LB}$ of the second level shifter 240) and the drain of the NMOS transistor M32 (to the gate of which is connected the output voltage $V_{LN}$ of the second level shifter 240). The drain of the PMOS transistor M36 is connected in common to a connection node which is connected to the drain and the gate of the NMOS transistor M34, so that from the connection node the internal voltage $V_L$ can be generated. The respective sources of the NMOS transistors M32, M33, M34 are connected to ground voltage via the NMOS transistor M37 (to the gate of which is applied the bias voltage $V_B$).

The operation and effects of the thusly constituted internal voltage control circuit for a memory device according to the present invention will now be described.

First, when power is turned on in the current source 210, there occurs current through the PMOS transistor M22. The NMOS transistors M20, N21 serve as a current mirror, so that there occurs current $I_R$ from the PMOS transistors M22, M23 and the NMOS transistor M21 which are formed into a current mirror in accordance with the NMOS transistor M21. Therein, when a weight value of the NMOS transistor M20 is formed less than that of the NMOS transistor M21, and the value of the current $I_R$ is obtained as '$V_{GS21}-V_{GS20}/R_1$', the lower a temperature in the circuit, the less becomes the current $I_R$.

Here, the resistance $R_1$ formed of polysilicon becomes weaker as a temperature in the circuit becomes lower. However, the lessened amount of the circuit is not sufficiently big to affect on a variation amount of the current $I_R$.

At this time, the first level shifter 220 decides a gate voltage of the PMOS transistor M24 in accordance with the current $I_R$ generated in the current source 210, and in accordance with a gate voltage of the PMOS transistor M24 the respective gate voltages of the PMOS transistor M25, M26, M27 are determined, whereby the level of the voltage $V_{LN}$ is determined. Here, when a temperature in the circuit becomes lower, the voltage induced in the PMOS transistor M23 of the current source 210 becomes decreased, and accordingly the current $I_R$ becomes lessened, thereby decreasing the output voltage $V_{LN}$ of the level shifter 220.

Also, during a burn-in operation, the bias circuit 230 outputs bias voltage V1 to the second level shifter 240 by poly resistance $R_2$ and the transistor M28, wherein the lower the value of the poly resistance $R_2$, the higher becomes the level of the bias voltage V1.

At this time, the second level shifter 240 determined the gate voltage of the NMOS transistor M29 by the output voltage V1 of the bias circuit 230, and in accordance with the gate voltage of the NMOS transistor M29, the respective gate voltage values of the PMOS transistors M30, M31 are determined, thereby outputting voltage $V_{LB}$. Therein, when the level of the voltage V1 becomes heightened in accordance with a lowered internal temperature, more current flows through the NMOS transistor M29, so that because the voltage induced in the PMOS transistor M30, M31 becomes increased, the voltage $V_{LB}$ is lowered as the internal temperature becomes lower.

Figure 4:
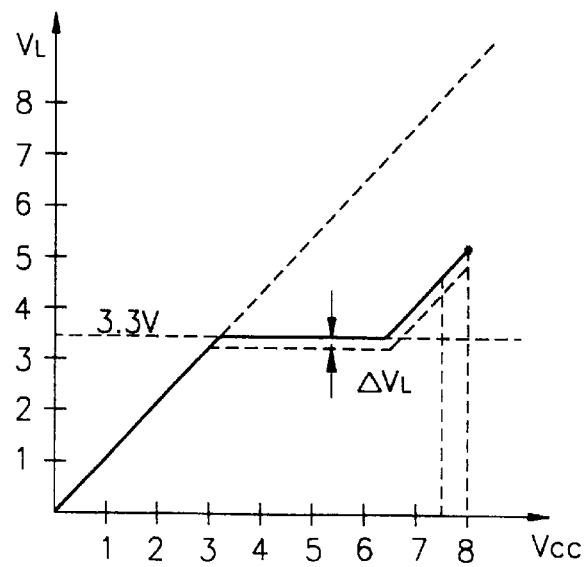
FIG. 4 is a graph illustrating a wave form in accordance with an internal voltage in the circuit of FIG. 3.

Therefore, in the buffer 250, when the bias voltage $V_B$ is turned to a high level and the NMOS transistor M37 becomes turned on, the buffer 250 is differentially amplified in accordance with the output voltages $V_{LN}$, $V_{LB}$ of the first and second level shifters 220, 240, thereby generating the internal voltage $V_L$ as shown in FIG. 4. When the output voltage $V_{LN}$ of the first level shifter 220 is larger than the output voltage $V_{LB}$ of the second level shifter 240, the NMOS transistors M32, M33 become differentially operated, respectively, thereby generating the internal voltage $V_L$. When the output voltage $V_{LN}$ of the first level shifter 220 is less than the output voltage $V_{LB}$ of the second level shifter 240, the NMOS transistors M33, M34 become differentially operated, respectively, thereby generating the internal voltage $V_L$.

Therein, during a lower-temperature operation, as the level of the bias voltage V1 becomes heightened, the output voltage $V_{LB}$ of the second level shifter 240 becomes lower, whereby the level of the internal voltage $V_L$ becomes slightly lower at a low temperature than at a high temperature.

As described above, the internal constant voltage control circuit for a semiconductor memory device according to the present invention prevents noise caused by a timing error or an excessive current flow from occurring by making the level of the internal voltage slightly lower at a low temperature than at a high temperature.

Further, during a burn-in operation, the characteristic of the internal voltage which tends to be increased at a high temperature is employed, and a normal operation range of the voltage circuit becomes wider at a low temperature because voltage becomes decreased at a low temperature.

What is claimed is:

1. An internal constant voltage control circuit for a semiconductor memory device, comprising:
   a current source for generating voltage in accordance with current when power is turned on;
   a bias circuit for outputting a first bias voltage;
   a first level shifter for directly receiving the output voltage of the current source and outputting a first voltage;
   a second level shifter for directly receiving the output voltage of the bias circuit and outputting a second voltage; and
   a buffer for differentially amplifying the output voltage of the first level shifter and the output voltage of the second level shifter, and generating an internal voltage.

2. An internal constant voltage control circuit for a semiconductor memory device, comprising:
   a current source for generating voltage in accordance with current when power is turned on;
   a bias circuit for outputting a first bias voltage;
   a first level shifter for receiving the output voltage of the current source and outputting a first voltage;
   a second level shifter for receiving the output voltage of the bias circuit and outputting a second voltage; and
   a buffer for differentially amplifying the output voltage of the first level shifter and the output voltage of the second level shifter, and generating an internal voltage;
   wherein the current source outputs a constant voltage although a current flow is decreased due to a lowered temperature therein.

3. circuit of claim 2, wherein the current source includes:
   a first NMOS transistor, a source of which is connected a ground voltage via a resistance and a gate of which is connected to a gate and a drain of a second NMOS transistor;
   said second NMOS transistor, a source of which is connected to the ground voltage, and said gate and drain of which is connected to a drain of a first PMOS transistor;
   said first PMOS transistor, a source of which is connected to a supply voltage and a gate of which is connected to a gate and a drain of a second PMOS transistor; and
   said second PMOS transistor, a source of which is connected to the supply voltage, and a drain of which is connected to a drain of the first NMOS transistor to the first level shifter.

4. The circuit of claim 3, wherein although in accordance with a lowered temperature therein a current flowing through the resistance is lessened, the amount of current variation becomes a value approximating zero.

5. The circuit of claim 3, wherein the resistance is formed of polysilicon.

6. The circuit of claim 3, wherein a current driving force of the first NMOS transistor has a value larger than that of the second NMOS transistor.

7. The circuit of claim 3, wherein the first level shifter includes a third PMOS transistor and a resistance circuit serially connected between a supply voltage terminal and a ground voltage terminal, so that the gate of the third PMOS transistor is connected to the current source, and an output voltage is generated at a connection node between the third PMOS transistor and the resistance circuit.

8. The circuit of claim 7, wherein the resistance circuit is comprised of a plurality of PMOS transistors serially connected to each other, and respective gates and drains of the plurality of PMOS transistors are connected to a same connection node.

9. The circuit of claim 2, wherein the current source includes:

a first NMOS transistor, a source of which is connected to a ground voltage via a resistance and a gate of which is connected to a gate and a drain of a second NMOS transistor;

said second NMOS transistor, a source of which is connected to the ground voltage, said gate and drain of which is connected to a drain of a first PMOS transistor;

said first PMOS transistor, a source of which is connected to a supply voltage and a gate of which is connected to a gate and a drain of a second PMOS transistor; and said second PMOS transistor, a source of which is connected to the supply voltage and a drain of which is connected to a drain of the first NMOS transistor and to the first level shifter.

10. An internal constant voltage control circuit for a semiconductor memory device, comprising:

a current source for generating voltage in accordance with current when power is turned on;

a bias circuit for outputting a first bias voltage;

a first level shifter for receiving the output voltage of the current source and outputting a first voltage;

a second level shifter for receiving the output voltage of the bias circuit and outputting a second voltage; and a buffer for differentially amplifying the output voltage of the first level shifter and the output voltage of the second level shifter, and generating an internal voltage;

wherein an output voltage level of the bias circuit becomes higher when a temperature therein becomes lower.

11. The circuit of claim 10, wherein the bias circuit includes a drain and a gate of a first NMOS transistor, a source of which is connected to a ground voltage and a drain of which is connected to a supply voltage via a resistance, said drain of said first NMOS transistor also being connected to the second level shifter.

12. The circuit of claim 11, wherein the lower a temperature in the bias circuit, the smaller becomes the value of the resistance.

13. The circuit of claim 10, wherein a first NMOS transistor and a resistance circuit are serially connected between a supply voltage terminal and a ground voltage terminal, so that a gate of the first NMOS transistor is connected to the bias circuit, and an output voltage is generated at a connection node between the first NMOS transistor and the resistance circuit.

14. The circuit of claim 13, wherein the resistance circuit is comprised of a plurality of PMOS transistors serially connected to each other, and respective gates and drains of the plurality of PMOS transistors are connected to a same connection node.

15. The circuit of claim 13, wherein the resistance circuit is comprised of three PMOS transistors serially connected to each other, and respective gates and drains of the three PMOS transistors are connected to a same connection node.

16. The circuit of claim 10, wherein the buffer includes:

a first PMOS transistor and a second PMOS transistor, sources of which are connected to a supply voltage, a gate and drain of said first PMOS transistor and a gate of said second PMOS transistor being connected in common to a connection node, said connection node being connected to drains of a first NMOS transistor and a second NMOS transistor;

said first NMOS transistor, a gate of which is connected to the output voltage of the first level shifters;

said second NMOS transistor, a gate of which is connected to the output voltage of the second level shifter; and a third NMOS transistor, a drain and a gate of which are connected to said drain of said second PMOS transistor, the internal voltage being generated at said gate of said third NMOS transistor, and respective sources of the first NMOS through third NMOS transistor being connected to a ground voltage via a fourth NMOS transistor, a gate of which is connected to the second bias voltage.

17. The circuit of claim 10, wherein in the bias circuit, a drain and a gate of fifth transistor to a source of which is connected to a ground voltage are respectively connected to a connection node which is also connected to a resistance connected to a supply voltage, and the connection node is connected to the second level shifter.

* * * * *